United States Patent
Wei et al.

(10) Patent No.: US 7,354,839 B2
(45) Date of Patent: Apr. 8, 2008

(54) GATE STRUCTURE AND A TRANSISTOR HAVING ASYMMETRIC SPACER ELEMENTS AND METHODS OF FORMING THE SAME

(75) Inventors: Andy Wei, Dresden (DE); Gert Burbach, Dresden (DE); David Greenlaw, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 80 days.

(21) Appl. No.: 11/247,367

(22) Filed: Oct. 11, 2005

(65) Prior Publication Data
US 2006/0194381 A1    Aug. 31, 2006

(30) Foreign Application Priority Data
Feb. 28, 2005   (DE)   ............... 10 2005 009 023

(51) Int. Cl.
*H01L 21/336* (2006.01)
(52) U.S. Cl. ............... 438/305; 257/E21.626; 257/E21.64
(58) Field of Classification Search ........ 438/303, 438/305; 257/E21.626, E21.64
See application file for complete search history.

(56) References Cited

U.S. PATENT DOCUMENTS 6,794,256 B1   9/2004   Fuselier et al. ............. 438/286

2007/0072382 A1*   3/2007   Yamamoto et al. ......... 438/305

FOREIGN PATENT DOCUMENTS

DE   100 11 885 A1   11/2001

* cited by examiner

*Primary Examiner*—Mary Wilczewski
*Assistant Examiner*—Seth Barnes
(74) *Attorney, Agent, or Firm*—Williams, Morgan & Amerson, P.C.

(57) ABSTRACT

Methods for forming asymmetric gate structures comprising spacer elements disposed on the opposed sides of a gate electrode and having a different width are disclosed. The asymmetric gate structures are employed to form an asymmetric design of a halo region and extension regions of a field effect transistor using a symmetric implantation scheme, or to further enhance the effectiveness of asymmetric implantation schemes. The transistor performance may be significantly enhanced for a given basic transistor architecture. In particular, a large overlap area may be created at the source side with a steep concentration gradient of the PN junction due to the provision of the halo region, whereas the drain overlap may be significantly reduced or may even be completely avoided to further enhance the transistor performance.

13 Claims, 7 Drawing Sheets

GATE STRUCTURE AND A TRANSISTOR HAVING ASYMMETRIC SPACER ELEMENTS AND METHODS OF FORMING THE SAME

BACKGROUND OF THE INVENTION

1. Field of the Invention

The present invention generally relates to the fabrication of integrated circuits, and, more particularly, to the design of individual field effect transistor elements so as to enhance the performance thereof.

2. Description of the Related Art

Integrated circuits typically include a large number of individual circuit elements, such as transistors, capacitors, resistors and the like. These individual circuit elements are electrically connected according to the desired circuit layout by respective conductive lines, which are mainly formed in separate "wiring" layers that are typically referred to as metallization layers. For enhancing the performance of the integrated circuit, usually the number of individual circuit elements is increased, thereby obtaining a more complex functionality of the circuit, and associated therewith the feature sizes of the individual circuit elements are reduced.

Generally, a plurality of process technologies are currently practiced, wherein, for logic circuitry, such as microprocessors, storage chips and the like, CMOS technology is presently the most promising approach due to the superior characteristics in view of operating speed, manufacturing costs and/or power consumption. During the fabrication of complex integrated circuits using CMOS technology, millions of complementary transistors, i.e., N-channel transistors and P-channel transistors, are formed in and on an appropriate crystalline semiconductor material, wherein currently the vast majority of logic circuitry is fabricated on the basis of silicon. Typically, a MOS transistor, irrespective of whether an N-channel transistor or a P-channel transistor is considered, comprises so-called PN junctions that are formed at an interface of highly doped drain and source regions with a channel region disposed between the drain region and the source region, wherein the channel region is at least partially inversely doped with respect to the drain and source regions.

The conductivity of the channel region (which represents an essential device criterion, as the reduced current drive capability of scaled devices has to be, at least partially, compensated for by an increased conductivity) is controlled by a gate electrode formed above the channel region and separated therefrom by a thin insulating layer. The conductivity of the channel region depends on the dopant concentration, the mobility of the charge carriers and, for a given dimension of the channel region in the transistor width direction, the distance between the source and drain regions, which is also referred to as channel length.

In addition to the conductivity, the transistor performance is also significantly influenced by its capability of rapidly creating a conductive channel in the channel region upon application of a specified control voltage to the gate electrode, since usually the transistors are operated in a switched mode requiring a fast transition from the transistor on-state to the transistor off-state and vice versa.

Moreover, other aspects also have to be taken into consideration when designing a transistor of a high performance circuit. For instance, static and dynamic leakage currents may significantly affect the overall performance of an integrated circuit, as the achievable amount of heat dissipation that is required for transistor architectures producing high dynamic and/or static leakage currents may restrict the maximum practical operating frequency.

With reference to FIG. 1, a typical transistor architecture of a field effect transistor element will now be described in more detail in order to more clearly explain some of the problems encountered in currently used transistor designs. In FIG. 1, a transistor element 100 comprises a substrate 101, which may represent a bulk semiconductor substrate such as a silicon substrate, or any other appropriate substrate having formed thereon a crystalline semiconductor layer, which may typically be formed on the basis of silicon for logic circuitry. Thus, the substrate 101 is to be considered as a substrate having formed thereon a substantially crystalline semiconductor region 102, in which are formed a drain region 104 including a so-called extension region 104e. Similarly, a source region 103 is formed in the crystalline region 102 and includes an extension region 103e. The area disposed between the extension regions 103e and 104e is referred to as a channel region 105, since here typically a conductive channel is created during the on-state of the transistor 100, as will described later on.

Located above the channel region 105 is a gate electrode structure 106 that includes a gate electrode 107 and sidewall spacers 108, 112. Moreover, a gate insulation layer 109 is provided between the gate electrode 107 and the semiconductor region 102 to electrically insulate the gate electrode 107 from any conductive regions within the crystalline semiconductor region 102. Regarding the design and material composition of the gate electrode structure 106, it is to be noted that in principle the gate electrode 107 may be considered as a conductive line, the "width" dimension of which is referred to as a gate length 107a, whereas the "length" of the line, extending in a direction perpendicular to the drawing plane, is referred to as the gate width (not shown in FIG. 1). The gate electrode 107 may be comprised of any appropriate material and is typically formed in advanced silicon-based integrated circuits of heavily doped polysilicon in combination with a highly conductive metal silicide, such as nickel silicide, cobalt silicide and the like. However, depending on the process strategy and the design criteria, other materials, such as metals, may be used. Frequently, the gate electrode structure 106 comprises the sidewall spacers 108, 112 which may, depending on process strategies, include one or more individual spacer elements and liners, wherein, for convenience, merely one offset spacer 112, for instance comprised of silicon dioxide, and one spacer 108, for instance comprised of silicon nitride, is shown.

The gate insulation layer 109 may be comprised of any appropriate insulating material such as silicon dioxide, silicon nitride and/or high-k materials to provide a required electrical insulation while maintaining a high capacitive coupling to the channel region 105. Hence, for well approved silicon dioxide based gate insulation layers, a thickness of the gate insulation layer 109 is on the order of a few nanometers, for example 2 nm and less, thereby causing moderately high static leakage currents, which may amount to approximately 30% or even more of the overall electrical losses of advanced transistor elements. Other transistor characteristics, such as switching losses and the like, will be explained later on when a typical process flow for forming the transistor 100 is discussed.

During the manufacturing process, the substrate 101 is treated to form the semiconductor region 102 with high crystalline quality, which may be achieved by epitaxial growth and the like. Thereafter, photolithography, etch and deposition processes may be performed to define the dimensions of the semiconductor region 102 by providing appropriate isolation structures (not shown). Thereafter, implantation sequences may be carried out to position one or more dopants within the crystalline semiconductor region 102 to thereby form a specified vertical dopant profile (not shown) within the region 102, which may finally result in a specified vertical dopant profile in the channel region 105.

Next, material layers for the gate insulation layer 109 and the gate electrode 107 may be formed, for instance by advanced oxidation and/or deposition techniques for the gate insulation material and by advanced low pressure chemical vapor deposition (LPCVD) for a polycrystalline silicon layer as a gate electrode material. Thereafter, highly sophisticated photolithography and etch techniques may be employed to pattern the gate electrode material and the gate insulation layer material to form the gate electrode 107 and the gate insulation layer 109 on the basis of the design gate length 107a. The gate electrode 107 may be etched by a two step (anisotropic/isotropic) etch process, wherein the polycrystalline silicon layer is predominantly anisotropically etched but a thin sub-layer (not shown) of a few nanometers is finally isotropically etched to reduce damage of the gate insulation layer 109 and of the underlying silicon regions typically caused by anisotropic etch processes.

Thereafter, complex implantation cycles may be performed to create the drain and source regions 103, 104 and the corresponding extensions 103e, 104e, wherein the gate electrode 107, partially in combination with the sidewall spacers 108, 112, acts as an implantation mask. For example, according to one strategy, a so-called pre-amorphization implantation may be carried out, during which a heavy ion species, such as xenon ions and the like, may be implanted into the crystalline semiconductor region 102 to substantially completely destroy the crystalline lattice to a specified depth, which may help in reducing any channeling effects during subsequent implantation processes. During the pre-amorphization implantation, the ion beam may be tilted with respect to a direction 110 perpendicular to the substrate 101 so as to also amorphize an area of the region 102 corresponding to the extension regions 103e, 104e.

Thereafter, a so-called halo implantation may be performed in which an ion species is introduced that represents the same conductivity type as is already present in the channel region 105 to enhance the dopant concentration of this ion species within specific halo regions, which are indicated as 111. Similarly to the pre-amorphization implantation, the halo implantation may be performed with respective tilt angles, such as $\alpha$ and $-\alpha$, to form the halo regions 111 at the drain side and the source side. Subsequently, a further implantation may be performed with an ion species having the opposite conductivity type with respect to the halo implantation to form the source extension 103e and the drain extension 104e, wherein an offset spacer 112 may be formed on sidewalls of the gate electrode 107 prior to the implantation. Thereafter, the sidewall spacer 108 may be formed and may be used in a subsequent implantation process as an implantation mask to form the deep and heavily doped drain and source regions 104, 103.

Thereafter, the transistor element 100 may be annealed to activate the dopant introduced by the preceding implantation sequences, i.e., to initiate a diffusion to place the dopants at lattice sites while substantially re-crystallizing those portions of the region 102 that were damaged by the pre-amorphization and the subsequent implantation processes. During this anneal cycle, thermally induced diffusion of the dopants occurs in accordance with the respective concentration gradient of the dopant species under consideration, thereby substantially determining the finally obtained size and characteristics of the drain and source regions 104, 103 and the corresponding extension regions 104e, 103e, as well as the characteristics of PN junctions 103p and 104p defined as an interface area between the halo implantation region 111 and the respective drain or source region 104, 103. During the implantation cycles and/or during the subsequent anneal cycle, a certain amount of overlap, referred to as overlap regions 103o and 104o, is created, which also significantly affects the transistor behavior. Thereafter, the manufacturing process may be continued with the formation of metal silicide regions in the drain and source regions 104, 103 and in the gate electrode 107 followed by the formation of an interlayer dielectric and respective contacts to the drain and source regions 104, 103 and the gate electrode 107. For convenience, these components are not shown in FIG. 1.

During operation, typically a supply voltage is applied to the drain region 104 and the source region 103, for example 2-5 volts for typical CPUs, while a corresponding control voltage is applied to the gate electrode 107 to define the status of the channel region 105. For the following discussion, the transistor 100 is considered to represent an N-channel enhancement type transistor in which the channel region 105 is P-doped and the drain and source regions 104, 103 and the corresponding extensions 104e, 103e are heavily N-doped. For a P-channel enhancement type transistor, the type of charge carriers involved and the conductivity type of the dopants may be inverted. Also, the following explanations in principle apply to depletion type transistors. Hence, upon application of a control voltage to the gate electrode 107 below a specific threshold voltage, which is determined by, among other things, the vertical dopant profile within the channel region 105, the transistor 100 is in the off-state, that is the PN junction 104p is inversely biased and hence a current from the source region 103 through the channel region 105 to the drain region 104 is substantially suppressed. However, during the off-state, the high electrical field prevailing at the overlap 104o may lead to tunnel currents into the gate electrode 107, especially when the gate insulation layer 109 is moderately thin, as is the case in sophisticated transistor devices. These currents may be considered as static leakage currents. Moreover, the overlap region 104o in combination with the overlying gate electrode 107 and the gate insulation layer 109 forms a capacitor, which has to be charged and discharged when operating the transistor 100 in a switched mode.

During application of a control voltage exceeding the threshold voltage, a conductive channel is formed in the channel region 105 originating from the source-side extension region 103e and terminating at the drain-side extension region 104e. For building up of the conductive channel, in the present case created by electrons, the overlap region 103o, as well as the relatively steep concentration gradient of the PN junction 103p, created by the increased dopant concentration of the halo region 111 is advantageous in obtaining a high on-current. Contrary thereto, the steep concentration gradient at the PN junction 104p may lead to enhanced currents into the substrate 101, that is, in lower-lying crystalline areas of the region 102, which may finally be drained off by a corresponding body contact, so that the dynamic leakage currents may also increase with an increase of the on-current. Moreover, during the building up of the conductive channel, the parasitic capacitances caused by the overlaps 104o, 103o may require high currents for recharging the parasitic capacitor and may delay the start of the on-state, thereby degrading the raise and fall times during the switching operation. In typical applications such as, for example, CMOS applications, the parasitic, so-called miller source capacitance, has to be discharged or loaded in each switching operation, whereas concurrently the miller drain capacitance has to be discharged and recharged with the opposite polarity in each switching operation. Thus, in conventional (symmetric) CMOS transistors, the drain miller capacitance requires twice the charge alteration of the source capacitance for each switching operation.

As can be seen from the above discussion, in addition to the overall geometric configuration of the transistor 100, such as transistor length and width, as well as material compositions, dopant concentrations and the like, also the lateral and vertical dopant profiling within the semiconductor region 102 significantly affects the finally obtained transistor performance. Due to the ongoing scaling of transistor elements, resulting in continuously increased operating speeds, a corresponding design of the drain and source architecture is important so as to not unduly offset any performance advantages gained by reducing the feature sizes owing to the increased static and dynamic losses and parasitic capacitances.

In view of the above situation, there exists a need for an improved technique that may maintain a high degree of compatibility with the conventional process flow and simultaneously enable improved drain and source designs so as to obtain an increased overall performance of highly scaled transistor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables enhancement of transistor performance by performing the halo implantation and the extension implantation in an asymmetric manner with respect to a drain and source region so as to provide enhanced current drive capabilities while reducing static and dynamic leakage currents as well as parasitic drain capacitances. Asymmetric spacer structures are employed to enhance the formation of a conductive channel, thereby improving the drive current capability of the transistor and reducing the drain/gate overlap and thus the parasitic drain/gate capacitance.

According to one illustrative embodiment of the present invention, a method comprises providing a gate electrode having opposed sidewalls and side regions adjacent to the opposed sidewalls. The method further comprises incorporating dopants into the gate electrode with a different dopant concentration in the side regions, and forming spacer elements adjacent to the side regions having a different width correlated with the dopant concentration of the respective underlying side region.

According to another illustrative embodiment of the present invention, a method comprises providing a semiconductor region having formed thereabove a gate electrode having opposed sidewalls and forming asymmetric spacer elements adjacent to the opposed sidewalls, the spacer elements having a different width. The method further comprises implanting dopants into the semiconductor region using the gate electrode and the spacer elements as masking elements.

According to still a further illustrative embodiment of the present invention, a gate structure comprises a gate electrode having opposed sidewalls and a gate insulating layer separating the gate electrode from an underlying semiconductor region. The gate structure further comprises a first spacer element and a second spacer element formed adjacent to the opposed sidewalls, wherein the first spacer element defines a position of a source region and the second spacer element defines a position of a drain region, wherein the first and second spacer elements have a different width.

BRIEF DESCRIPTION OF THE DRAWINGS

The invention may be understood by reference to the following description taken in conjunction with the accompanying drawings, in which like reference numerals identify like elements, and in which.

Figure 1:
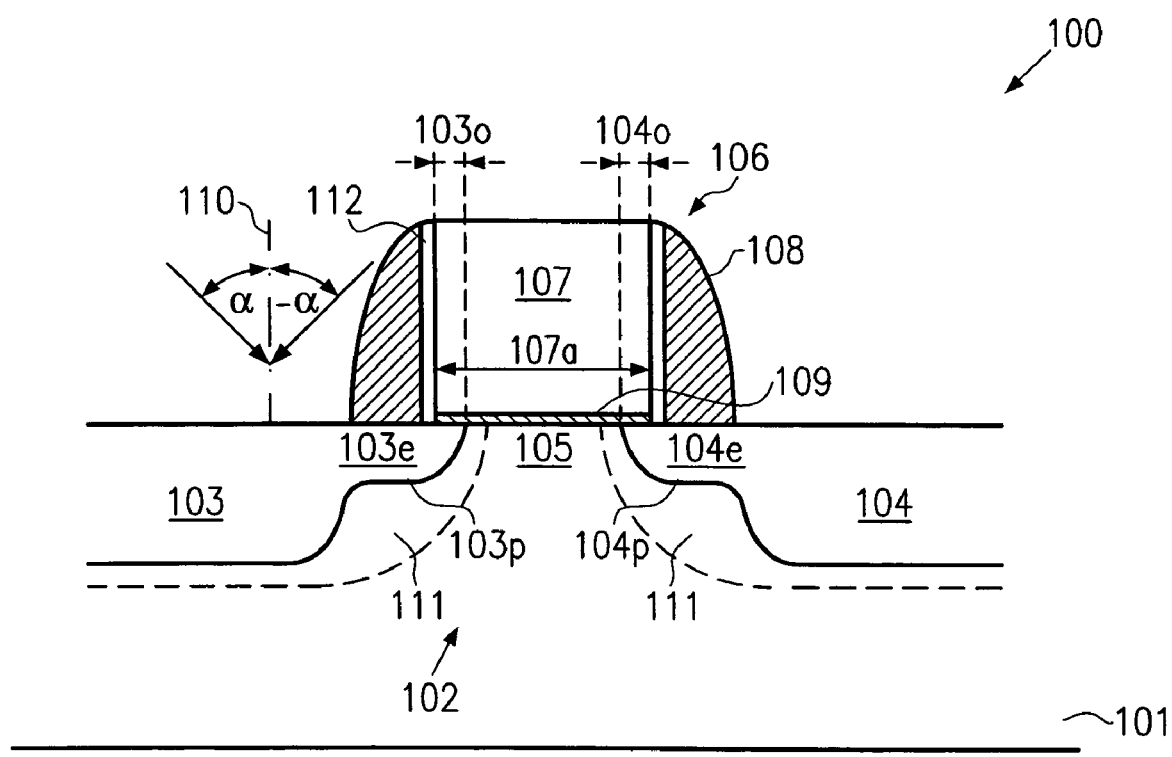
FIG. 1 schematically shows a cross-sectional view of a typical conventional architecture of a field effect transistor with symmetrically formed spacers, halo and drain and source regions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that the transistor performance may be enhanced by correspondingly adjusting the source and drain extensions' overlap with the gate electrode to provide an enhanced current drive capability, while the drain overlap may be decreased to reduce the drain overlap capacitance, the so called drain miller capacitance. To this end, asymmetric gate structures comprising spacers having different widths may be employed to define the source and drain extension regions. The manufacturing processes of the asymmetric gate structure may be readily carried out with the presently available semiconductor manufacturing tools. Thus, transistors having an asymmetric source/drain overlap may be formed while still maintaining a high degree of compatibility with the conventional process flow of the present technology node.

In a further embodiment the concentration gradient at the drain-side PN junction may be formed and engineered to be less as compared to the source-side PN junction by correspondingly reducing the halo dopant concentration at the drain side or even substantially completely avoiding a halo implantation region at the drain side. Consequently, by correspondingly modifying implantation cycles on the basis of a basic transistor design for a given technology node, the transistor performance may be significantly enhanced while still maintaining a high degree of compatibility with the conventional process flow of the present technology node. With reference to FIGS. 2a-2e, 3a-3d and 4a-4c, further illustrative embodiments of the present invention will now be described in more detail. It should be appreciated that the term "MOS" or "CMOS" is to be understood as including any technology using field effect transistors, irrespective of the specific transistor design.

Figure 2A:
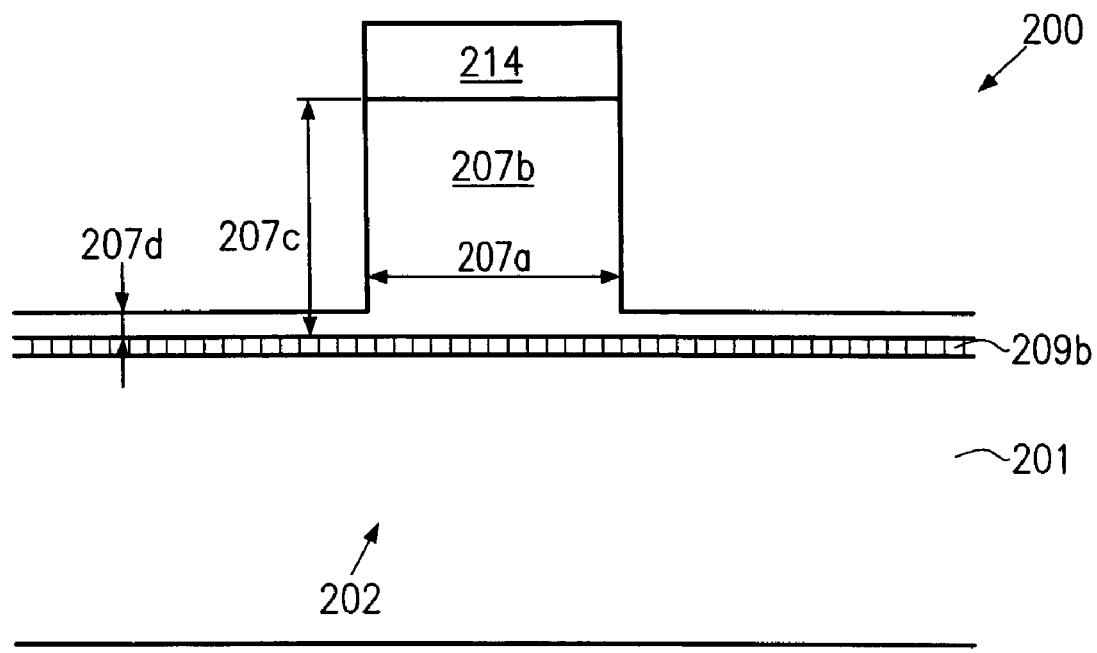
FIGS. 2a-2e schematically show cross-sectional views of a gate structure having asymmetrically formed spacer elements during various manufacturing steps in accordance with illustrative embodiments of the present invention.

FIG. 2a schematically shows a cross-sectional view of a gate structure 200 during an initial manufacturing stage. The gate structure 200 comprises a substrate 201, which may represent a bulk semiconductor substrate, an insulating substrate having formed thereon a crystalline semiconductor layer, and the like. For instance, the substrate 201 may represent a bulk silicon substrate having formed thereon, for example as an upper portion thereof, a crystalline semiconductor region 202 which may be comprised of silicon, silicon/germanium and the like. The substrate 201 may also be provided as a silicon-on-insulator (SOI) substrate wherein the semiconductor region 202 may represent a silicon layer that may have included therein, except for any dopants, other materials such as germanium, carbon and the like. It should be appreciated that the present invention may readily be applied to any appropriate semiconductor material, such as gallium arsenide, germanium, or any other III-V, or II-VI semiconductor materials, although the vast majority of logic circuitry is presently manufactured on the basis of silicon.

A partially etched gate electrode 207b having a gate length 207a, which may be formed of any appropriate material, such as polysilicon in silicon-based devices, is formed above the semiconductor region 202. The gate electrode 207b is covered by an etch mask element 214 that may be formed of photoresist material. The etch mask element 214 may further comprise an anti-reflective coating (ARC) sub-layer (not shown). The gate electrode 207b is separated from the semiconductor region 202 by a gate insulation layer 209b. As previously explained, the material composition of the gate insulation layer 209b is not necessarily restricted to oxides but may include any insulating material that exhibits the desired insulation characteristics in combination with process compatibility and permittivity characteristics. For example, the gate insulation layer 209 may be comprised of nitrogen-enriched silicon dioxide, silicon dioxide, silicon nitride or any other high-k dielectric materials, possibly in combination with one or more of the preceding materials. The dimensions of the gate electrode 207b, for example the gate length 207a, and the thickness of the gate insulation layer 209b may be selected in conformity with design requirements and are substantially determined by the design rules of a specified technology node. For example, in advanced gate structures, the gate length 207a may be on the order of 50 nm and even less with a thickness of the gate insulation layer 209 in the range of 1.5-2.0 nm when the material composition is based on silicon dioxide. It should be appreciated, however, that the principles and the teaching provided herein are independent from specific device dimensions and thus the present invention may also advantageously be practiced in conjunction with less advanced transistor devices.

A typical process flow for forming the gate structure 200 as shown in FIG. 2a may comprise substantially the same process steps with respect to the formation of the gate electrode 207 and of the gate insulation layer 209b as are previously described with reference to the transistor 100 in FIG. 1. The thickness 207c of the gate electrode 207 may vary depending on the particular application. In one illustrative embodiment, the thickness 207c of a polycrystalline silicon layer providing the gate electrode material is chosen to be in the range of approximately 50-150 nm. The etch mask element 214 is employed to anisotropically etch the polycrystalline silicon layer. The polysilicon etch process may be stopped to form a remaining thin polysilicon sub-layer. The thickness 207d of the thin sub-layer, however, contrary to the sub-layer described with respect to FIG. 1, may be determined based upon a penetration depth of a subsequently performed implantation process as described with respect to FIG. 2b. In one illustrative embodiment, the thickness 207d may typically range from approximately 10-25 nm.

Figure 2B:
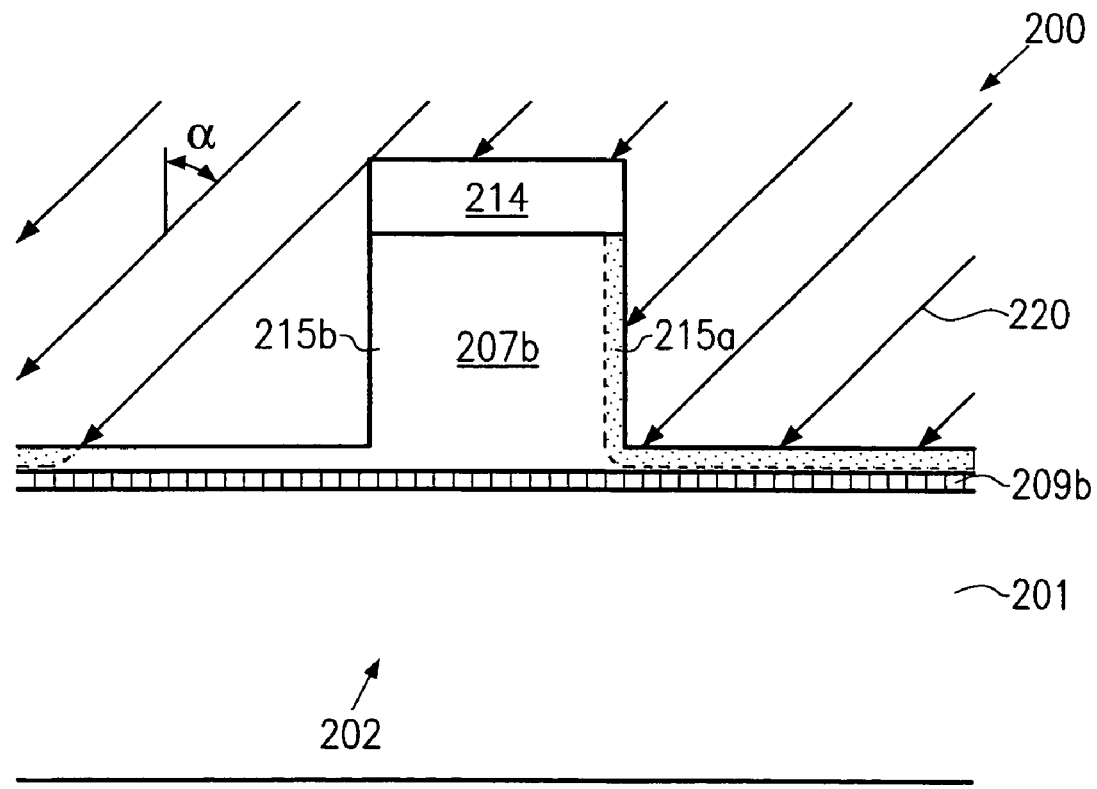

FIG. 2b schematically shows the gate structure 200 during an ion implantation 220 for forming a side region 215a of higher dopant concentration in the partially etched gate electrode 207b compared to the opposed side region 215b. The implantation 220 is performed by employing a high tilt angle α so as to deposit the dopant in the region 215a. The tilt angle α may range from approximately 10-50 degrees. The implantation is typically performed on the entire substrate in a single step. Hence, all gate structures on the substrate intended for asymmetric spacer formation need to be accordingly oriented on the substrate. Any structures not intended for asymmetric spacer formation or intended for different asymmetric spacer formation processes, for example gate structures of complementary transistors of CMOS devices, need to be processed by employing corresponding masking steps. The dopant may comprise the species conventionally employed to dope the gate electrode to improve the gate electrode conductivity, such as boron, phosphorous, arsenic or indium. The chosen implantation parameters depend on the employed implantation species. The respective implantation energy and implantation angle is further adjusted to the thickness 207d of the thin poly silicon sub-layer so that the dopant does not penetrate into the underlying silicon substrate 201. It is to be noted that the implantation parameters for the implantation 220 may readily be obtained by carrying out corresponding simulations, for which appropriate computer programs are available. For example, based on the simulation results, corresponding test parameters may be established and may be used as a basis for test and production processes. The parameters may then be finely tuned by corresponding test results or by monitoring measurement data obtained from processed product wafers.

Figure 2C:
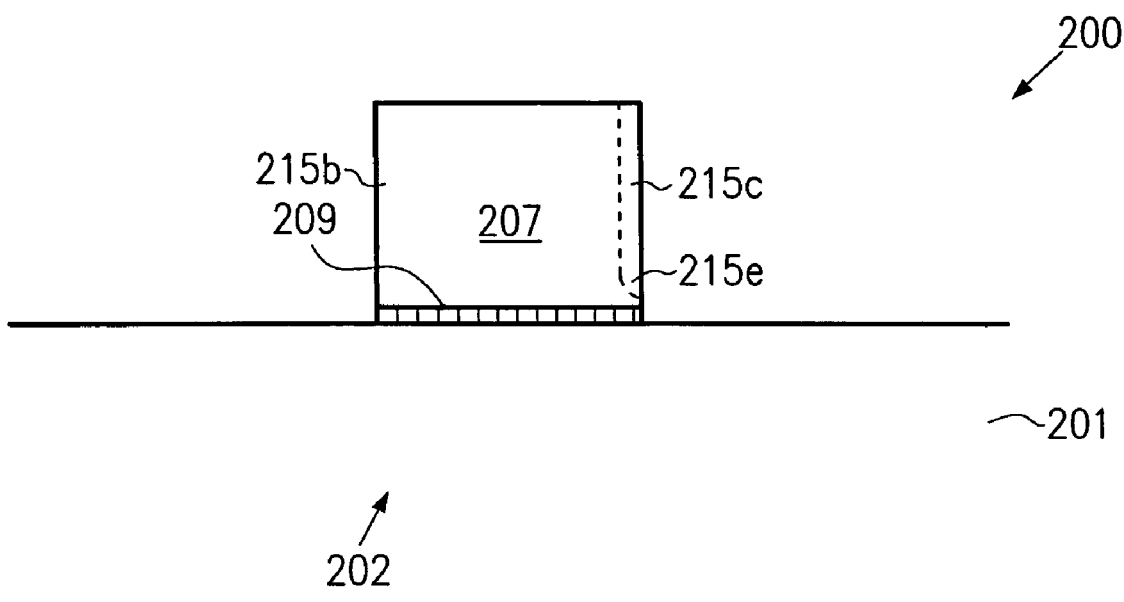

FIG. 2c schematically shows the gate structure 200 after completion of the gate etch process including the gate insulation layer etch process and after removal of the etch mask element 214. A side region 215c of high dopant concentration is located at one side of the gate electrode 207. The anisotropic gate etch process described with respect to FIG. 2a is continued to further reduce the thickness 207d of the thin polycrystalline silicon sub-layer, e.g., to a few nanometers. The remaining polycrystalline silicon sub-layer may be subsequently removed in a conventional isotropic etch process.

In one embodiment, the thickness 207d of the thin polycrystalline silicon sub-layer may be reduced in the anisotropic gate etch process described with respect to FIG. 2a to a thickness that allows removal of the remaining thin polycrystalline silicon sub-layer entirely by an isotropic etch process. The implantation parameters then need to be adapted accordingly (high tilt angle implantation) to ensure that the dopant does not penetrate into the underlying silicon layer and is sufficiently deeply implanted in the region 215c so that the required asymmetric dopant concentration remains in the gate electrode after the isotropic etch process.

Figure 2D:
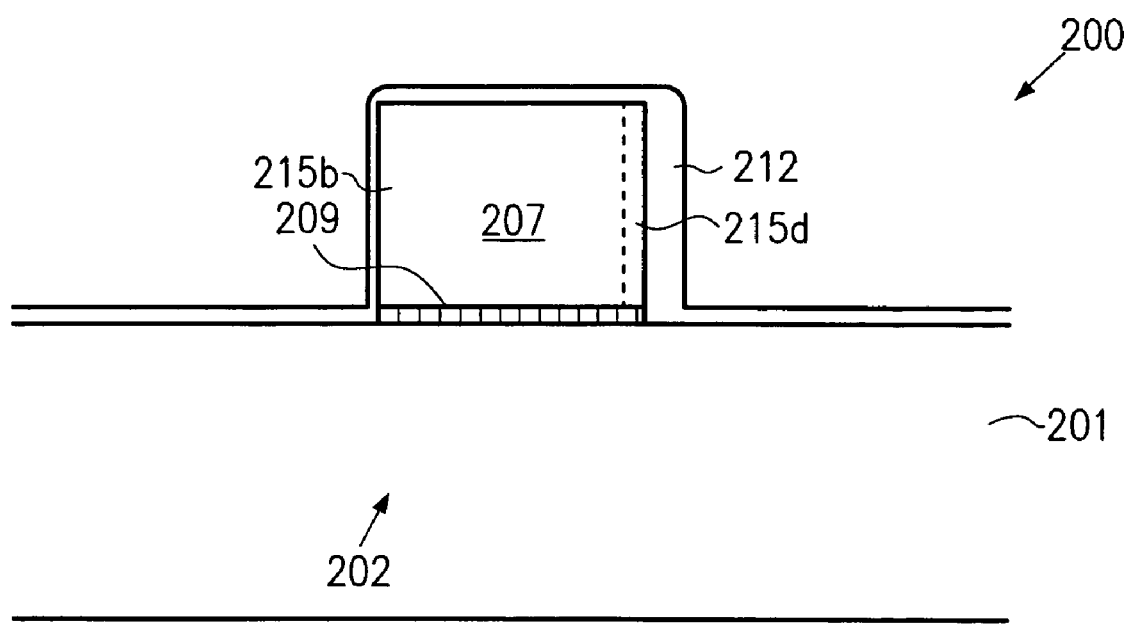

FIG. 2d schematically shows the gate structure 200 after performing a thermal oxidation step. The thermal oxidation may be performed in a wet or dry oxygen-containing atmosphere in a temperature range from approximately 800-1100° C. for approximately 10-1000 seconds to grow a silicon oxide layer 212 on the substrate 201 and on the gate electrode 207. The oxide growing rate on the gate electrode 207 depends on the dopant concentration in the underlying polysilicon region so that the growing rate is higher on regions with higher dopant concentration. Thus, a thicker oxide is grown on the sidewall of the gate electrode 207 adjacent to the region 215d than on the opposite sidewall adjacent to the region 215b. Due to the lower dopant concentration in a portion 215e of the region 215d adjacent to the lower corner of the gate electrode 207, the thermal oxide may be less thick than on upper sidewall regions. As a result of the high vertical diffusivity of the dopants in the gate electrode due to the grain structure of the polycrystalline silicon, however, the effect is only marginal. Thus, the asymmetric oxide layer 212 may serve to form a gate structure 200 with asymmetric gate sidewall spacers. An optional process step to form individual asymmetric spacer elements from the asymmetric oxide layer 212 is additionally described with respect to FIG. 2e.

Figure 2E:
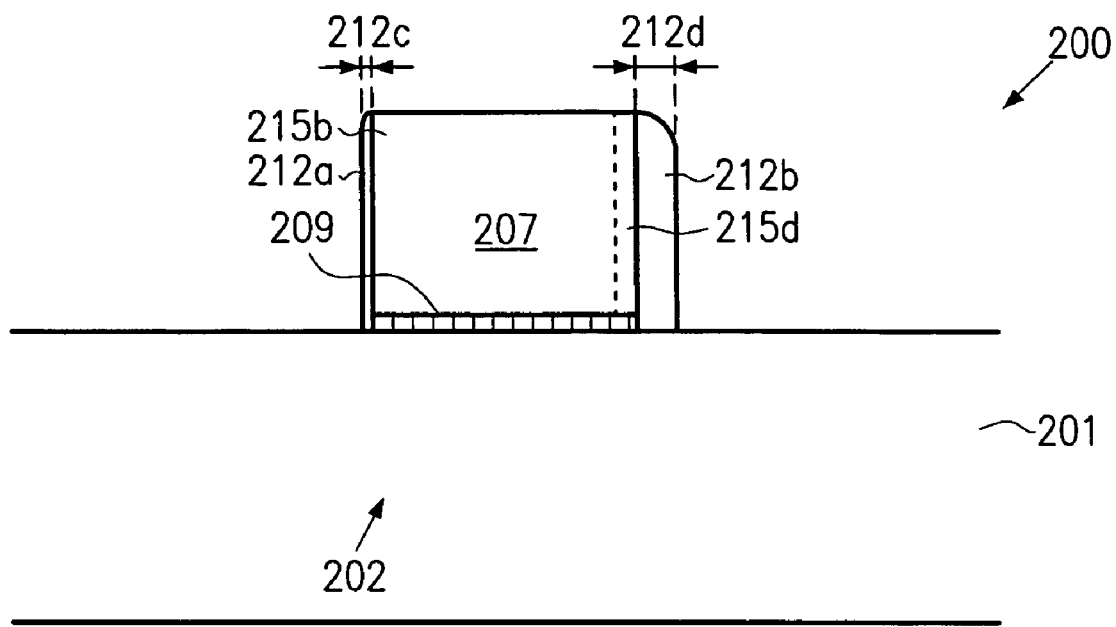

FIG. 2e schematically shows the gate structure 200 after performing a further etch step to form individual asymmetric spacer elements 212a and 212b. Any conventional anisotropic oxide-spacer etch process may be employed to form the spacer elements 212a and 212b. In a further embodiment, an isotropic etch process, for example, a wet hydrofluoric acid (HF) etch process, may be employed to reduce the thickness of the asymmetric oxide layer 212 of FIG. 2d until only a portion of the thicker region grown on region 215d remains and forms a single spacer element (not shown). The width 212c, 212d of the asymmetric spacer elements 212a, 212b may be adjusted by the chosen etch time. In addition, the width 212c, 212d may be determined by the obtained dopant concentration in region 215 and the chosen oxidation time for growing the oxide layer 212 (FIG. 2d). It should be noted that the dimensions of the asymmetric spacer elements 212a, 212b may be selected so as to obtain a desired masking effect during a subsequent implantation for forming source and drain extensions, as will be described later on with reference to FIG. 4a. In one illustrative embodiment, the width 212c of spacer element 212a is in the range of approximately 1-20 nm and the width 212d of spacer element 212b is in the range of approximately 1-30 nm. The relative difference in the width 212c and 212d of the spacer elements 212a, 212b is in the range of approximately 1-20 nm.

Figure 3A:
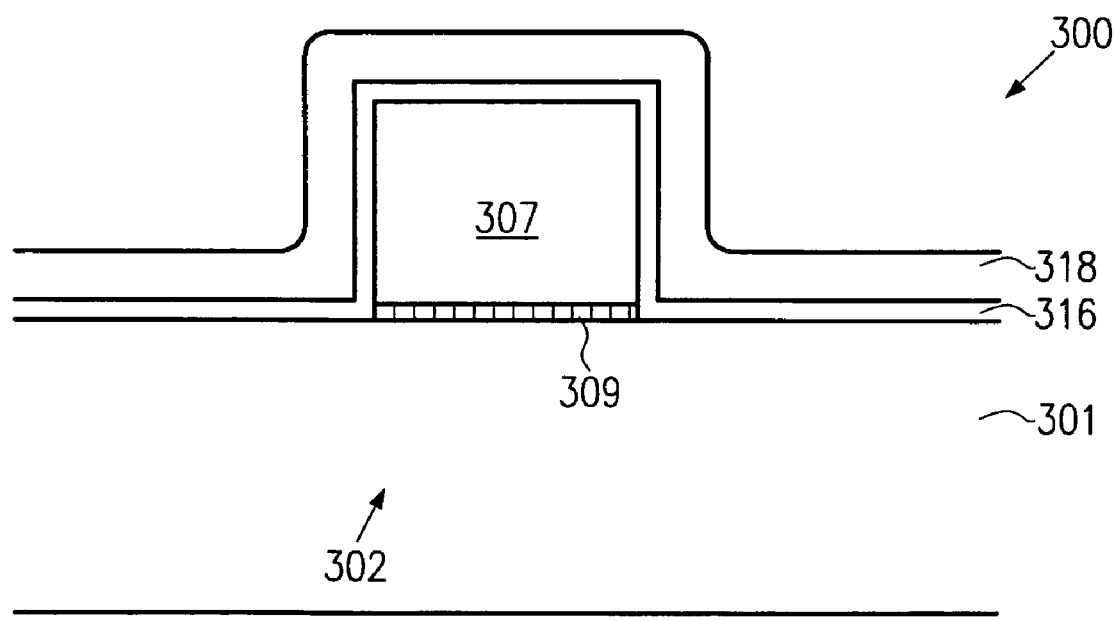
FIGS. 3a-3d schematically show cross-sectional views of a gate structure during various manufacturing stages of a further method for forming asymmetric spacer elements.

FIGS. 3a-3d schematically show a further process flow appropriate to form the asymmetric gate structure of the present invention. FIG. 3a schematically shows a cross-sectional view of a gate structure 300 during an initial manufacturing stage. The gate structure 300 comprises a substrate 301 and a gate electrode 307 separated by a gate insulation layer 309. A liner layer 316 is formed on the substrate 301 and on the gate electrode 307. Above the liner layer 316, a layer 318 of dielectric material is deposited.

The liner layer 316 may comprise a dielectric material, such as silicon dioxide or silicon nitride, that exhibits a certain etch selectivity to other dielectric materials and to silicon. The liner layer 316 may be deposited, for example, by well established chemical vapor deposition (CVD) or, in the case of silicon dioxide, may be formed by thermal oxidation. The dielectric layer 318 may comprise, for example, silicon dioxide or silicon nitride, and may be deposited by well known CVD processes. The material of the dielectric layer 318, in turn, may be chosen to exhibit a desired etch selectivity to the material of the liner layer 316.

Figure 3B:
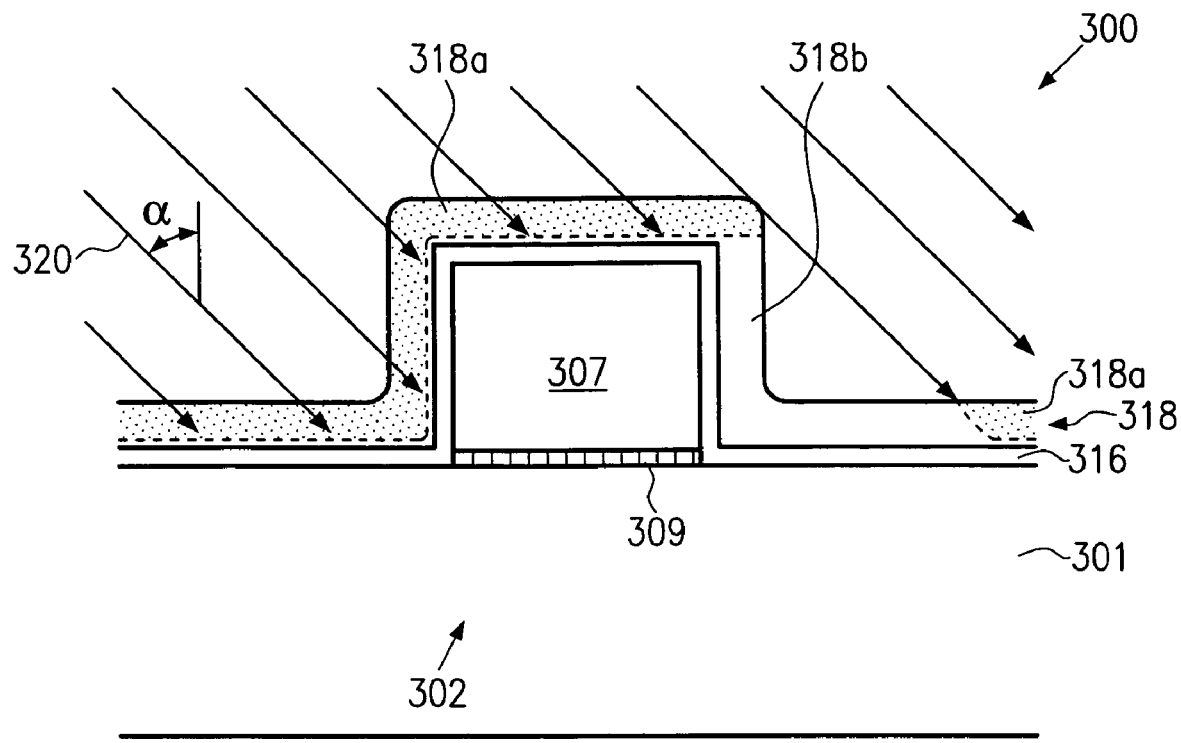

FIG. 3b schematically shows the gate structure 300 during an ion implantation 320 for forming doped regions 318a and undoped regions 318b in the dielectric layer 318. A tilt angle ion implantation is performed with a tilt angle $\alpha$ in the range of approximately 10-50 degrees so that the ions are implanted into the entire dielectric layer 318 except for a region adjacent to the sidewall of the gate electrode 307 that is shielded by the gate electrode 307. Any ion species that significantly alters the etch rate of the dielectric material may be implanted, such as, for example, ions of inert materials such as argon, neon, xenon or nitrogen, or of oxygen, silicon or germanium or a mixture thereof. It is to be noted that the employed ion species is substantially removed in subsequent etch processes so that the choice of the ion species may be made with respect to the achieved etch rate modification. In a specific embodiment, xenon is chosen since xenon is a heavy element that may cause the required modification in the dielectric layer at a rather low implantation dose. The implantation parameters may be chosen with respect to the thickness of the dielectric layer 318 as set forth above with respect to the implantation 220 of FIG. 2b. The doped regions 318a may exhibit a higher etch rate compared to the etch rate of undoped regions 318b of the dielectric layer 318.

Figure 3C:
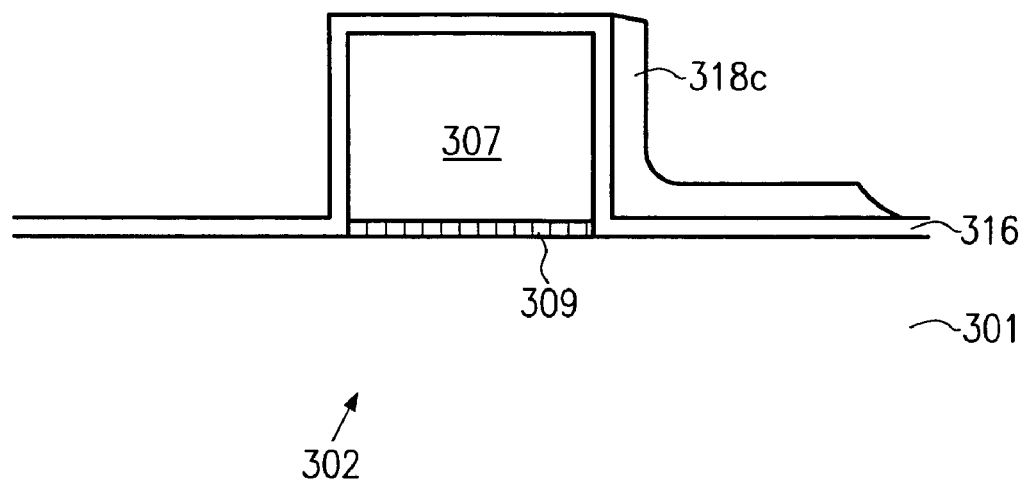

FIG. 3c schematically shows the gate structure 300 after carrying out a wet and/or a dry isotropic etch process. Corresponding etch processes for silicon oxide and silicon nitride are well-established semiconductor manufacturing processes. Hot phosphoric acid, for example, may be employed to etch silicon nitride, with the required etch selectivity to an underlying oxide liner layer, and hydrofluoric acid (HF), for example, may be employed to etch silicon oxide with the required etch selectivity to a silicon nitride liner layer. The doped regions 318a are substantially removed while, due to the lower etch rate, the undoped regions 318 may partially remain and form the region 318c. Since over-etching of the doped region 318a may be substantially avoided to prevent undue removal of the undoped material of the region 318b, residuals of the doped regions may remain on the liner layer 316. These residuals may then be removed in a subsequently performed anisotropic etch process employed to form a spacer element from the remaining material of region 318b.

Figure 3D:
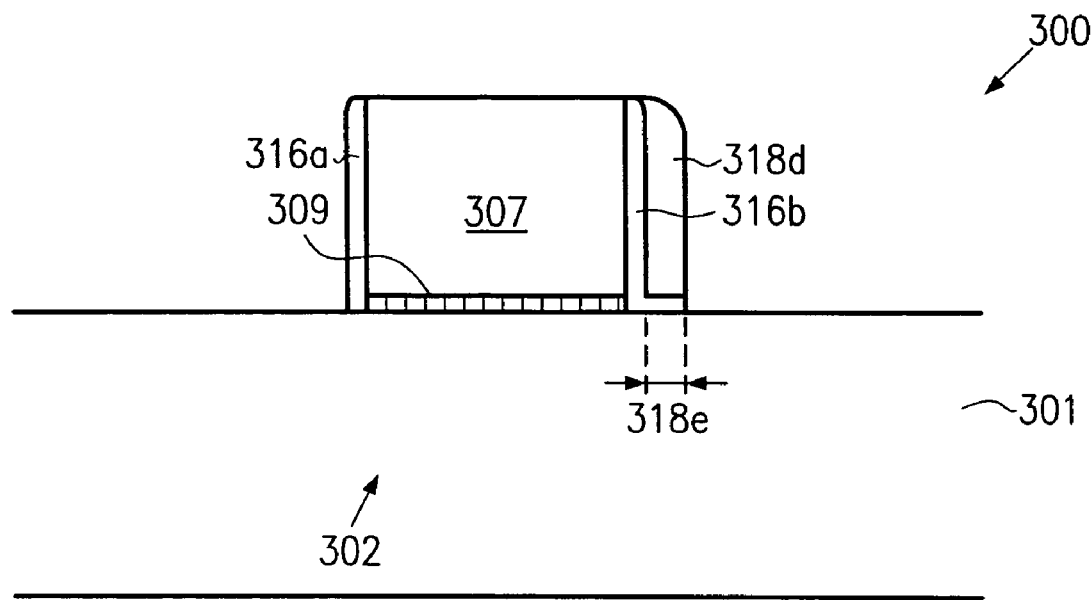

FIG. 3d schematically shows the gate structure 300 after an anisotropic etch process used to form the desired single spacer 318d adjacent to one side of the gate electrode 307. The spacer 318d may be formed by a well known anisotropic spacer etch process, such as an anisotropic dry reactive ion etch (RIE) process. The width 318e of the spacer 318d is substantially determined by the thickness of the etched undoped region 318c. This thickness, in turn, depends on the thickness of the initially deposited dielectric layer 318 and on the ratio of the etch rates of the doped region 318a and undoped region 318b. Thus, the width 318e of the spacer 318d may be adjusted by choosing the thickness of the dielectric layer 318 with respect to the obtained etch rates ratio. Accordingly, adapted process parameters may be obtained from test runs. If required, the liner layer 316 may optionally be removed from the top of the gate electrode 307 and from the substrate 301. In one embodiment, the spacer element 316a may also be removed by an isotropic etch process so that only the spacer elements 316b and 318d remain.

The gate structures 200, 300 comprising the asymmetrically formed spacers may be employed to form a transistor element having asymmetric source/drain extensions. A corresponding process flow is depicted in FIGS. 4a-4c.

Figure 4A:
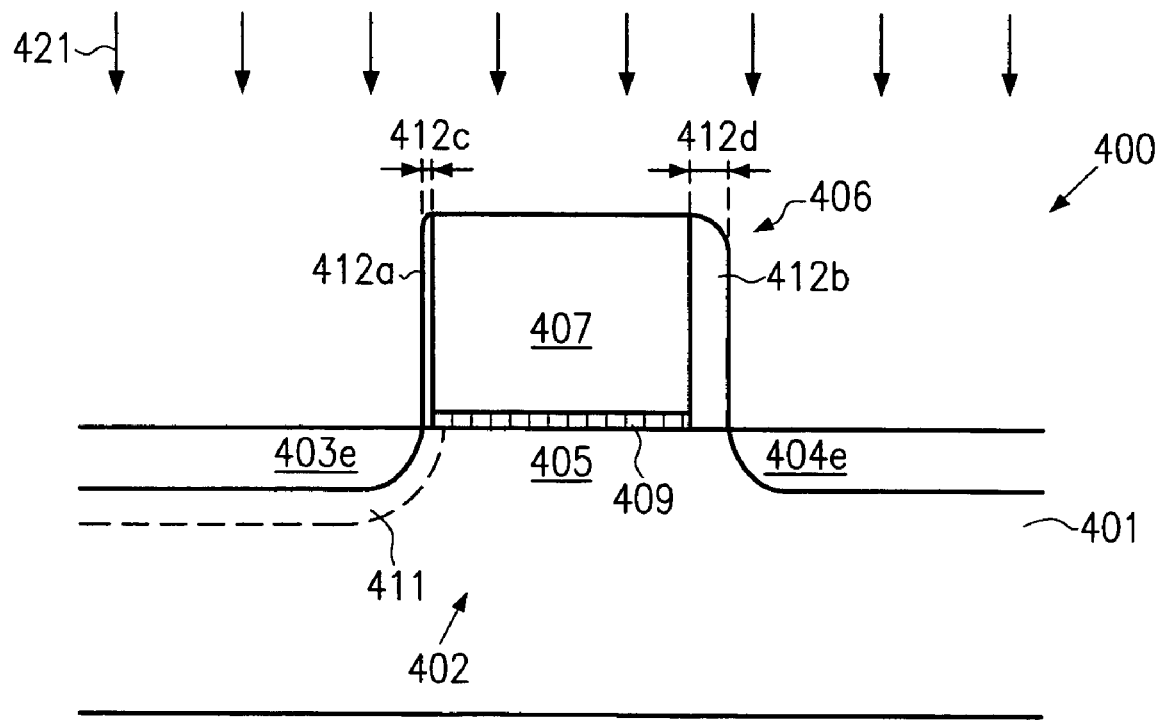
FIGS. 4a-4c schematically show cross-sectional views of a transistor element during various manufacturing stages for forming an asymmetric halo and drain and source design in accordance with illustrative embodiments of the present invention.
Figure 4B:
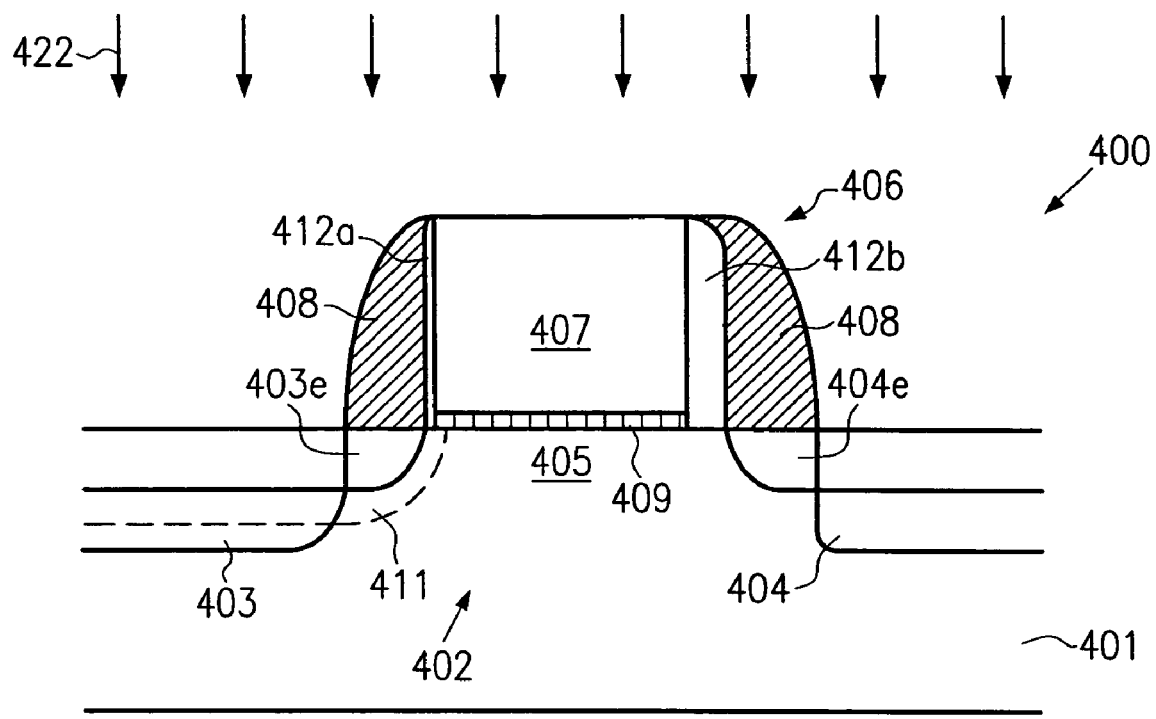
Figure 4C:
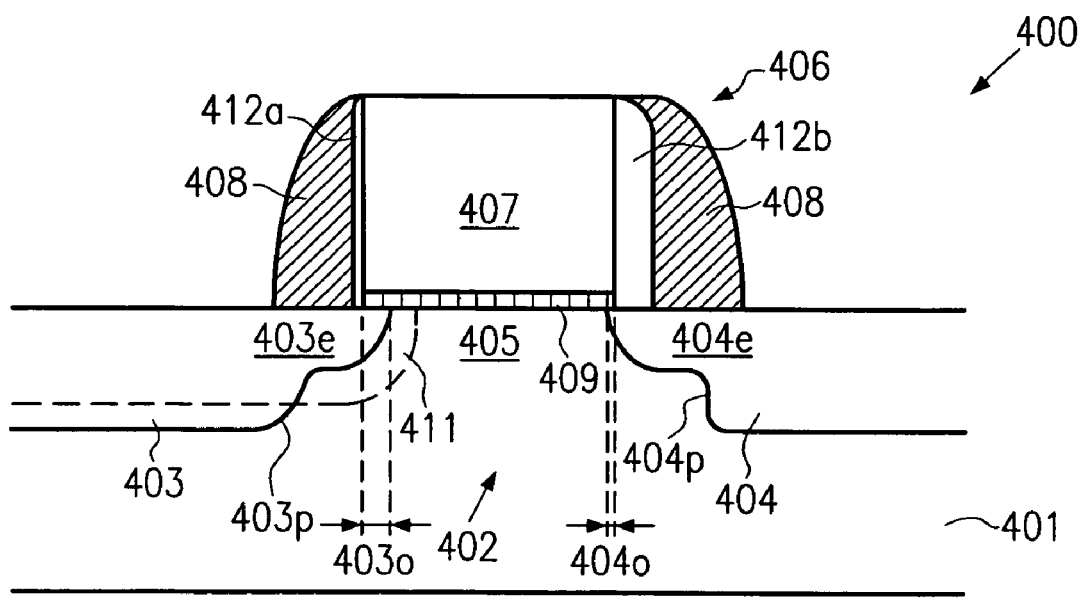

FIG. 4a schematically shows a transistor element 400 during a source/drain extension implantation 421. The transistor element 400 comprises a gate structure 406 with asymmetrically formed spacer elements 412a, 412b. The gate structure 406 further comprises a gate electrode 407 separated by a gate insulation layer 409 from the substrate 401. The asymmetric spacer elements 412a, 412b are formed adjacent to the sidewalls of the gate electrode 407 and have a different spacer width 412c, 412d. The width 412d of the spacer element 412b is grater than the width 412c of the spacer element 412a. The substrate 401 comprises a semiconductor region 402. A source extension region 403e, a drain extension region 404e and a channel region 405 lying in between are defined in the semiconductor region 402, wherein the position of the channel region 405 is determined by the location of the gate electrode 407 and by the asymmetry of the spacer elements 412a, 412b. The transistor element 400 further comprises an asymmetrically formed halo region 411.

The source/drain extension implantation 421 may be carried out by conventional source/drain extension implantation techniques, including zero angle and tilt angle implantations. Due to the asymmetric spacer design, a symmetric conventional source/drain extension implantation also results in a desired asymmetric source/drain architecture.

It is to be noted that, in addition, the asymmetric spacer may be employed to form asymmetric halo regions by well-established conventional "symmetric" halo implantation techniques. In a specific embodiment, a single halo region 411 is formed in the semiconductor region 402 in the vicinity of a source-side of the gate electrode 407, while the semiconductor region 402 substantially lacks a halo region in the vicinity of a drain-side. It should be noted that the halo region 411 is defined by an increased dopant concentration compared to the dopant concentration in the channel region 405, as is also explained with reference to the halo regions 111 in FIG. 1.

In embodiments relating to FIG. 4a, the transistor element 400 is subjected to an halo ion implantation process (not shown) to form the halo region 411 asymmetrically, wherein the offset spacers 412a may be formed prior to the halo implantation, whereas, in other embodiments, the offset spacers 412a may be formed after the halo implantation process. During the halo implantation, a substantially parallel ion beam is directed to the semiconductor region 402 with a non-zero tilt angle with respect to a direction perpendicular to the surface of the substrate 401. In some embodiments, the tilt angle (not shown) may be selected so as to locate the specified ion species well below the gate electrode 407 at the source-side, thereby forming the halo region 411, while the gate electrode 407 masks the area in the vicinity of the drain-side. A tilt angle may be selected sufficiently high to obtain a moderate high overlap of the halo region 411 with the gate electrode 407. In some embodiments, a halo implantation with a single tilt angle may be considered sufficient for forming the halo region 411. Hereby, the implantation parameters, such as dose and energy, may be correspondingly adapted to obtain the desired shape for the halo region 411.

FIG. 4b schematically shows the transistor element 400 in a further advanced manufacturing stage during a deep source and drain implantation 422 forming the deep source region 403 and the deep drain region 404. Here, the transistor element 400 comprises additional sidewall spacers 408, which may include a liner (not shown) and which are formed on the spacers 412a, 412b. The gate electrode 407 in combination with the gate insulation layer 409 and any sidewall spacers 412a, 412b, 408 and liners form a gate electrode structure 406. It should be appreciated that the gate electrode structure 406 may represent any type of gate electrode including one or more asymmetric and symmetric spacer elements and liners as is required for the further profiling of the dopant concentration in the region 402 and/or for the formation of metal silicide regions in a self-adjusting manner and/or for forming epitaxially grown semiconductor regions over the drain region 404 and the source region 403, when a transistor architecture with raised drain and source regions is considered. Moreover, the gate electrode structure 406 is to include any configuration in which one or more of the sidewall spacers are temporarily formed in the gate electrode structure 406 and are removed at a later manufacturing state.

The transistor element 400 is subjected to the ion implantation process 422 to form the deep drain region 404 and the deep source region 403, while the sidewall spacers 412a, 412b, 408 in combination with the gate electrode 407 act as an implantation mask. As a consequence, the extension regions 403e, 404e and the halo region 411 are substantially maintained below the sidewall spacers 408 during the ion implantation process 422. Thus, the extension regions 403e, 404e exhibit a desired asymmetric shape and define a desired steep concentration gradient in conjunction with the halo region 411, while the concentration gradient at the drain-side exhibits a moderately steep gradient due to the substantial lack of the halo implant.

The manufacturing process for the transistor element 400 as shown in FIG. 4*b* may comprise substantially the same processes as are previously described with reference to FIG. 1, wherein the formation process for the sidewall spacers 408 may depend, as discussed above, on the specific transistor architecture.

FIG. 4*c* schematically shows the transistor element 400 in a further advanced manufacturing stage. In FIG. 4*c*, the finally obtained dopant profile, except for minor changes due to thermally induced diffusion in subsequent manufacturing processes, is shown, after the transistor element shown in FIG. 4*b* has been subjected to an anneal process to activate the dopants and also cure, at least partially, implantation-induced lattice damage. During the anneal cycle a specified amount of diffusion also takes place, which then determines the position of the PN junctions 403*p* and 404*p* with respect to the gate electrode 407. Hereby, the dopant concentration gradient, that is the transition from a specific dopant concentration of one conductivity type to a dopant concentration of the opposite conductivity type, is high at the PN junction 403*p* due to a moderately high concentration in the extension region 403*e* of the first conductivity type and the moderately high concentration in the halo region 411 of the opposite conductivity type. Moreover, the PN junction 403*p* defines an overlap area 403*o* at the source-side, which is significantly greater than any overlap 404*o* defined by the drain PN junction 404*p*. It should be noted that in particular embodiments no overlap at all or even a certain distance is defined between the PN junction 404*p* and the gate electrode 407. Seen from another point of view, the overlap regions 403*o* and 404*o* may be defined with respect to the electrode 407, thereby defining an asymmetric design, wherein it should be taken into consideration that the spatial relation of the respective PN junctions to the gate electrode 407 is actually the characteristic that essentially affects the transistor performance with respect to an overlap. Moreover, the concentration gradient at the PN junction 404*p* may in one embodiment be significantly less steep compared to the PN junction 403*p*, due to the lack of the halo region.

As a result, a transistor design is provided having an asymmetric design with respect to the position of the PN junctions of the drain and source 404, 403 with respect to the gate electrode 407, and which may also have an asymmetric configuration with respect to the concentration gradient at the respective PN junctions. In particular, the overlap area 403*o* at the source-side provides, in combination with a steep concentration gradient, enhanced drive current capability, while the absence or reduced size of an overlap 404*o* at the drain-side provides reduced parasitic capacitance, thereby improving the switching characteristics and also reducing static leakage currents. In addition, the moderately steep concentration gradient at the PN junction 404*p* may significantly reduce the dynamic leakage currents. As is evident from the above discussion, the relevant parameters substantially determining the transistor performance, such as the size of the overlap area 403*o*, the value of the dopant gradients at the PN junctions 403*p* and 404*p*, as well as the overall dopant concentration in the extension regions 403*e* and 404*e*, may be controlled by the process parameters of the halo implantation and of the source/drain extension implantation 421, in addition to appropriately selecting the dimensions and asymmetry of the offset spacer 412*a*, 412*b* and the sidewall spacer 408. Consequently, on the basis of well-established process techniques, the transistor performance for a given basic transistor architecture may be significantly enhanced while not unduly contributing to process complexity compared to a standard process flow, as is described for instance with reference to FIG. 1.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing an etching process on a layer of gate electrode material to define a partially etched gate electrode, said partially etched gate electrode having opposed sidewalls, side regions adjacent to said opposed sidewalls and a sub-layer of gate electrode material extending laterally away from said sidewalls;
   performing a tilt angle ion implantation process to incorporate dopants into said partially etched gate electrode to obtain a different dopant concentration in each of said side regions, said ion implantation process also introducing dopants into at least a portion of said sub-layer; and
   performing an oxidation process to form spacer elements adjacent to each of said side regions, each of said spacer elements having a different width correlated with said dopant concentration of the respective underlying side region.

2. The method of claim 1, wherein said gate electrode comprises polysilicon.

3. The method of claim 1, wherein said spacer elements comprise silicon dioxide.

4. The method of claim 1, wherein said tilt angle is in a range of approximately 10-50 degrees.

5. The method claim 1, wherein said dopants comprise at least one of boron, phosphorous, arsenic and indium.

6. The method of claim 1, wherein said gate electrode and said spacer elements form a gate structure serving as an implantation mask for a subsequent source/drain extension implantation into an underlying semiconductor region defining a source side and an opposed drain side of said gate electrode.

7. The method of claim 6, wherein the width of said spacer elements is greater on said drain side than on said source side.

8. The method of claim 7, wherein an asymmetric halo region is formed in said semiconductor region.

9. A method, comprising:
   providing a semiconductor region having formed thereabove a gate electrode having opposed sidewalls;
   forming asymmetric spacer elements adjacent to said opposed sidewalls, each of said asymmetric spacer elements having a different width, wherein forming said asymmetric spacer elements comprises:
      performing a tilt angle ion implantation process to implant dopants into an unmasked layer of spacer material formed above said gate electrode, said tilt angle ion implantation process providing an asymmetric distribution of said dopants; and after performing said tilt angle ion implantation process, performing an isotropic etch process on said layer of spacer material; and implanting additional dopants into said semiconductor region using said gate electrode and said spacer elements as masking elements.

10. The method of claim 9, wherein said spacer elements comprise at least one of silicon oxide and silicon nitride.

11. The method of claim 9, wherein said tilt angle is in a range of approximately 10-50 degrees.

12. The method of claim 9, wherein said dopants implanted during said tilt angle ion implantation process comprise at least one of silicon, germanium, nitrogen, argon, oxygen, neon and xenon.

13. The method of claim 9, further comprising forming a liner layer prior to forming said layer of spacer material, the material of said liner layer having an etch selectivity to said layer of spacer material.

* * * * *

UNITED STATES PATENT AND TRADEMARK OFFICE
CERTIFICATE OF CORRECTION

PATENT NO. : 7,354,839 B2
APPLICATION NO. : 11/247367
DATED : April 8, 2008
INVENTOR(S) : Andy Wei, Gert Burback and David Greenlaw Page 1 of 1

It is certified that error appears in the above-identified patent and that said Letters Patent is hereby corrected as shown below:

Col. 14, line 42, after "method" insert -- of --.

Signed and Sealed this

Seventeenth Day of June, 2008

JON W. DUDAS
*Director of the United States Patent and Trademark Office*